United States Patent
Nakada et al.

(10) Patent No.: US 9,318,559 B2
(45) Date of Patent: Apr. 19, 2016

(54) METHOD FOR PRODUCING GROUP III NITRIDE SEMICONDUCTOR AND TEMPLATE SUBSTRATE

(71) Applicant: TOYODA GOSEI CO., LTD., Kiyosu-Shi (JP)

(72) Inventors: Naoyuki Nakada, Kiyosu (JP); Koji Okuno, Kiyosu (JP); Yasuhisa Ushida, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/867,550

(22) Filed: Sep. 28, 2015

(65) Prior Publication Data
US 2016/0020285 A1    Jan. 21, 2016

Related U.S. Application Data

(62) Division of application No. 14/183,809, filed on Feb. 19, 2014, now Pat. No. 9,196,687, which is a division of application No. 12/654,562, filed on Dec. 23, 2009, now Pat. No. 8,680,581.

(30) Foreign Application Priority Data

Dec. 26, 2008   (JP) ................... 2008-333842
Dec. 26, 2008   (JP) ................... 2008-333999

(51) Int. Cl.
| | | |
|---|---|---|
| H01L 29/20 | (2006.01) | |
| H01L 21/02 | (2006.01) | |
| H01L 29/04 | (2006.01) | |

(52) U.S. Cl.
CPC ........ H01L 29/2003 (2013.01); H01L 21/0237 (2013.01); H01L 21/0242 (2013.01);

(Continued)

(58) Field of Classification Search
CPC ............ H01L 21/0237; H01L 21/0242; H01L 21/02433; H01L 21/02458; H01L 21/0262; H01L 21/02636; H01L 21/02639; H01L 21/02647; H01L 21/0254
See application file for complete search history.

(56) References Cited

U.S. PATENT DOCUMENTS

| | | | |
|---|---|---|---|
| 6,967,122 B2 | 11/2005 | Tezen | |
| 7,250,638 B2 | 7/2007 | Lee et al. | |

(Continued)

FOREIGN PATENT DOCUMENTS

| | | |
|---|---|---|
| CN | 1378702 A | 11/2002 |
| JP | 10-335702 A | 12/1998 |

(Continued)

OTHER PUBLICATIONS

Japanese Office Action (No. 2009-293463) dated Feb. 19, 2013 with Englisth translation.

(Continued)

*Primary Examiner* — Ermias Woldegeorgis
(74) *Attorney, Agent, or Firm* — McGinn IP Law Group, PLLC.

(57) ABSTRACT

A semiconductor substrate includes a sapphire substrate including a c-plane main surface and a groove in a surface thereof, the groove including side surfaces and a bottom surface, and a Group III nitride semiconductor layer formed on the sapphire substrate. The side surfaces of the groove are an a-plane of sapphire. An axis of the Group III nitride semiconductor layer, perpendicular to one of the side surface of the groove, is a c-axis of Group III nitride semiconductor. A plane of the Group III nitride semiconductor, parallel to the main surface of the sapphire substrate, is an a-plane of Group III nitride semiconductor.

6 Claims, 9 Drawing Sheets

(52) U.S. Cl.
CPC ........ *H01L21/0254* (2013.01); *H01L 21/0262* (2013.01); *H01L 21/02433* (2013.01); *H01L 21/02458* (2013.01); *H01L 21/02636* (2013.01); *H01L 21/02639* (2013.01); *H01L 21/02647* (2013.01); *H01L 29/045* (2013.01)

(56) References Cited

U.S. PATENT DOCUMENTS

| | | | |
|---|---|---|---|
| 7,462,867 | B2 | 12/2008 | Tezen |
| 7,462,881 | B2 | 12/2008 | Lee et al. |
| 7,563,629 | B2 | 7/2009 | Lee et al. |
| 7,569,865 | B2 | 8/2009 | Lee et al. |
| 7,576,368 | B2 | 8/2009 | Lee et al. |
| 7,588,952 | B2 | 9/2009 | Lee et al. |
| 7,816,705 | B2 | 10/2010 | Lee et al. |
| 7,928,465 | B2 | 4/2011 | Lee et al. |
| 8,384,120 | B2 | 2/2013 | Lee et al. |
| 2001/0041427 | A1 | 11/2001 | Gehrke et al. |
| 2002/0022287 | A1* | 2/2002 | Linthicum .......... H01L 21/0237 438/46 |
| 2003/0057444 | A1* | 3/2003 | Niki .................... H01L 33/007 257/200 |
| 2003/0162340 | A1 | 8/2003 | Tezen |
| 2003/0176001 | A1 | 9/2003 | Fukuyama et al. |
| 2003/0189215 | A1 | 10/2003 | Lee et al. |
| 2005/0098792 | A1 | 5/2005 | Lee et al. |
| 2006/0060866 | A1 | 3/2006 | Tezen |
| 2006/0071230 | A1 | 4/2006 | Lee et al. |
| 2006/0099730 | A1 | 5/2006 | Lee et al. |
| 2006/0244001 | A1 | 11/2006 | Lee et al. |
| 2007/0295986 | A1 | 12/2007 | Lee et al. |
| 2008/0001166 | A1 | 1/2008 | Lee et al. |
| 2009/0278161 | A1 | 11/2009 | Lee et al. |
| 2010/0308368 | A1 | 12/2010 | Lee et al. |
| 2011/0193128 | A1 | 8/2011 | Lee et al. |

FOREIGN PATENT DOCUMENTS

| | | |
|---|---|---|
| JP | 2000-106455 A | 4/2000 |
| JP | 2001-267242 A | 9/2001 |
| JP | 2002-8985 A | 1/2002 |
| JP | 2002-362999 A | 12/2002 |
| JP | 2003-282551 A | 10/2003 |
| JP | 2005-522873 A | 7/2005 |
| JP | 2006-36561 A | 2/2006 |
| JP | 2006-165070 A | 6/2006 |
| JP | 2006-232640 A | 9/2006 |
| WO | WO 01/27980 A1 | 4/2001 |
| WO | WO 01/69662 A1 | 9/2001 |
| WO | WO 03/088318 A2 | 10/2003 |
| WO | WO 03/088318 A3 | 10/2003 |

OTHER PUBLICATIONS

Japanese Office Action (No. 2009-293464) dated Feb. 19, 2013 with English translation.
Japanese Office Action (No. 2008-212461) dated Mar. 12, 2013 with English translation.
Hou-Guang; Chen et. al. "Dislocation reduction in GaN grown on stripe patterned r-Rlane sapphire substrates", Applied Physics Letters, 91,021914 (2007), pp. 021914-1-02914-3 (Of Record).
Chinese Office Action dated Mar. 2, 2012, with English translation.
Chinese Office Action dated Jun. 7, 2011, with English translation.
US Office Action dated Sep. 6, 2012 in U.S. Appl. No. 12/654,562.
US Office Action dated Feb. 5, 2013 in U.S. Appl. No. 12/654,562.
US Office Action dated Jul. 9, 2013 in U.S. Appl. No. 12/654,562.
Notice of Allowance dated Nov. 7, 2013 in U.S. Appl. No. 12/654,562.
United States Office Action dated Aug. 11, 2014 in the U.S. Appl. No. 14/183,809.
United States Notice of Allowance dated Jul. 27, 2015 in the U.S. Appl. No. 14/183,809.
Japanese Office Action dated Dec. 2, 2014 with partial English Translation.
Japanese Office Action dated Apr. 28, 2015 with partial English Translation.

* cited by examiner

Data corresponding to variation in sputtering time (2 inches, stripe) (vertical axis: log)

Fig. 7

Variation in X-ray rocking curve half width with respect to sputtering time (2 inches, stripe)

Variation in X-ray rocking curve half width with respect to sputtering time (3 inches, stripe)

METHOD FOR PRODUCING GROUP III NITRIDE SEMICONDUCTOR AND TEMPLATE SUBSTRATE

The present application is a Divisional Application of U.S. patent application Ser. No. 14/183,809, filed on Feb. 19, 2014, which is a Divisional Application of U.S. patent application Ser. No. 12/654,562, filed on Dec. 23, 2009, now U.S. Pat. No. 8,680,581, which is based on and claims priority from Japanese Patent Application No. 2008-333842, filed on Dec. 26, 2008, and Japanese Patent Application No. 2008-333999, filed on Sep. 26, 2008, the entire contents of which are incorporated herein by reference.

BACKGROUND OF THE INVENTION

1. Field of the Invention

The present invention relates to a method for producing a Group III nitride semiconductor product whose main surface is a non-polar plane (e.g., m-plane or a-plane) or a semi-polar plane (e.g., r-plane). The present invention also relates to a template substrate including a growth substrate and a Group III nitride semiconductor whose main surface is a non-polar plane or a semi-polar plane, the Group III nitride semiconductor being formed on the growth substrate.

2. Background Art

Hitherto, Group III nitride semiconductor device have been produced by stacking a Group III nitride semiconductor on a growth substrate (e.g., a sapphire substrate) in a c-axis direction. However, due to strain in the crystal structure of the Group III nitride semiconductor, a piezoelectric field is generated in a c-axis direction of the semiconductor, which may cause deterioration of device performance. When, for example, a light-emitting device is produced through the aforementioned process, internal quantum efficiency is lowered.

In recent years, in order to avoid deterioration of device performance due to generation of a piezoelectric field, attempts have been made to develop techniques for crystal growth of a Group III nitride semiconductor whose main surface is a non-polar plane (e.g., a-plane or m-plane) or a semi-polar plane (e.g., r-plane). Also, attempts have been made to use, as a growth substrate, a GaN substrate or GaN template substrate whose main surface is a non-polar plane (e.g., a-plane or m-plane) or a semi-polar plane (e.g., r-plane).

In a known crystal growth technique, a GaN substrate having an m-plane or a-plane main surface is used as a growth substrate. Such an m-plane or a-plane GaN substrate is produced by growing a thick GaN layer having a c-plane main surface on a growth substrate (e.g., sapphire) and cutting out the thus-grown GaN layer parallel to m-plane or a-plane.

Japanese Patent Application Laid-Open (kokai) No. 2006-36561 discloses production of GaN crystal or GaN template substrate having an a-plane or m-plane main surface, through the following process: stripe-pattern grooves are formed in a sapphire substrate (i.e., growth substrate) having an a-plane or m-plane main surface so that the longitudinal direction of the grooves is a c-axis direction; an $SiO_2$ mask is formed on the surface of the growth substrate, one side surface of each groove, and a portion of the bottom surface of the groove; a buffer layer is formed only on the other side surface of the groove; and GaN is grown on the side surfaces of the grooves on which the buffer layer has been formed.

However, when an m-plane or a-plane GaN substrate is produced through a conventional method, the size of the substrate cannot be increased, since the substrate size depends on the thickness of a GaN layer. In addition, the conventional method fails to mass-produce such a GaN substrate. When a GaN layer is formed on a growth substrate, a portion of the GaN layer proximal to the substrate exhibits poor crystallinity, whereas a portion thereof distal to the substrate exhibits good crystallinity. Therefore, in-plane variation in crystallinity occurs in an m-plane or a-plane GaN substrate produced through cutting out of the GaN layer.

The method disclosed in Japanese Patent Application Laid-Open (kokai) No. 2006-36561 encounters difficulty in selectively forming a mask or a buffer layer, and in growing, with high reproducibility, a Group III nitride semiconductor exhibiting good crystallinity and having an a-plane or m-plane main surface.

SUMMARY OF THE INVENTION

In view of the foregoing, an object of the present invention is to provide a method for producing a Group III nitride semiconductor product, which method realizes formation, with high reproducibility, of a Group III nitride semiconductor product whose main surface is a non-polar plane (e.g., a-plane or m-plane) or a semi-polar plane (e.g., r-plane). Another object of the present invention is to provide a template substrate including a growth substrate and a Group III nitride semiconductor whose main surface is a non-polar plane or a semi-polar plane, the semiconductor being formed on the growth substrate.

In a first aspect of the present invention, there is provided a method for producing a Group III nitride semiconductor product, comprising the steps of:

forming a groove in a surface of a growth substrate through etching;

heating, in an atmosphere containing hydrogen and ammonia, the growth substrate having the thus-formed groove to a temperature at which a Group III nitride semiconductor of interest is grown; and epitaxially growing the Group III nitride semiconductor on side surfaces of the groove at the growth temperature, wherein the growth temperature is regulated so that the Group III nitride semiconductor is grown primarily on the side surfaces of the groove in a direction parallel to the main surface of the growth substrate.

A Group III nitride semiconductor can be grown on the side surfaces of the groove primarily in a direction parallel to the main surface of the growth substrate by, for example, regulating the growth temperature to be lower than a temperature at which the Group III nitride semiconductor is grown on a planar growth substrate in a direction perpendicular to the substrate. In general, a Group III nitride semiconductor is grown in a c-axis direction at a temperature higher than 1,100° C. Therefore, when the growth temperature is 1,100° C. or lower, a Group III nitride semiconductor can be grown on the side surfaces of the groove primarily in a c-axis direction. The growth temperature is preferably 1,020° C. or higher. This is because, when the growth temperature is lower than 1,020° C., the resultant Group III nitride semiconductor exhibits poor crystallinity. Thus, the growth temperature of the Group III nitride semiconductor is preferably regulated to 1,020 to 1,100° C. The growth temperature is more preferably 1,020 to 1,060° C., from the viewpoints of better crystallinity and surface flatness of a Group III nitride semiconductor. The growth temperature is much more preferably 1,030 to 1,050° C.

A second aspect of the present invention is drawn to a specific embodiment of the production method according to the first aspect, which further comprises, between the step of forming the groove and the step of heating the growth substrate, the step of forming a buffer film on the surface of the growth substrate through sputtering, wherein the thickness of the buffer film is regulated so that the Group III nitride semiconductor is grown primarily on the side surfaces of the groove in a direction parallel to the main surface of the growth substrate.

That is, in the second aspect of the present invention, a buffer film is formed on the growth substrate, and the first aspect is carried out.

For formation of the buffer film, magnetron sputtering is preferably employed among sputtering techniques. No particular limitation is imposed on the material of the buffer film, so long as a Group III nitride semiconductor can be grown primarily on the side surfaces of the groove in a direction parallel to the main surface of the growth substrate. The material of the buffer film may be, for example, GaN, AlN, AlGaN, or AlGaInN. Particularly, AlN is preferably employed, from the viewpoint of lattice matching with sapphire.

A Group III nitride semiconductor can be epitaxially grown on the side surfaces of the groove primarily in a direction parallel to the main surface of the growth substrate by, for example, regulating the thickness of the buffer film to be smaller than that of a buffer film which is provided on a planar growth substrate when the Group III nitride semiconductor is grown, via the buffer film, on the planar growth substrate uniformly in a direction perpendicular to the planar growth substrate, and regulating the growth temperature to be lower than a temperature at which the Group III nitride semiconductor is grown, via the buffer film, on the planar growth substrate uniformly in a direction perpendicular to the main surface of the planar growth substrate. When an AlN buffer film is formed on the flat main surface of a sapphire substrate, and a Group III nitride semiconductor is grown perpendicular to the main surface of the buffer film in a c-axis direction, generally, the thickness of the buffer film is regulated to at least 150 to 200 Å. In contrast, in the present invention, the thickness of the buffer film is regulated to 150 Å or less, in order to increase the rate of growth of a Group III nitride semiconductor in a direction perpendicular to the side surfaces of the groove of the growth substrate to be higher than that of growth of the semiconductor in a direction perpendicular to the main surface of the substrate. Thus, the thickness of the buffer film is preferably 150 Å or less. From the viewpoint of good surface flatness of the thus-grown Group III nitride semiconductor, the thickness of the buffer film is preferably 55 Å or more. Therefore, the thickness of the buffer film is preferably 55 Å to 150 Å. More preferably, the thickness is regulated to 55 to 125 Å, from the viewpoints of better crystallinity and surface flatness of a Group III nitride semiconductor. The thickness is much more preferably 75 to 125 Å. The buffer film having such a thickness is preferably formed from AlN.

In general, a Group III nitride semiconductor is grown, via a buffer film, on a planar sapphire substrate in a c-axis direction at a temperature higher than 1,100° C. Therefore, when the growth temperature is 1,100° C. or lower, a Group III nitride semiconductor can be grown on the side surfaces of the groove primarily in a direction perpendicular to the growth substrate. The growth temperature is preferably 1,020° C. or higher. This is because, when the growth temperature is lower than 1,020° C., the resultant Group III nitride semiconductor exhibits poor crystallinity. Thus, the growth temperature of the Group III nitride semiconductor is preferably regulated to 1,020 to 1,100° C. The growth temperature is more preferably 1,020 to 1,060° C., from the viewpoints of better crystallinity and surface flatness of a Group III nitride semiconductor. The growth temperature is much more preferably 1,030 to 1,050° C. The thickness of the buffer film must be smaller than a thickness at which the Group III nitride semiconductor is grown in a direction perpendicular to the main surface of the growth substrate, and must be a thickness at which crystallinity is not impaired. Most preferably, the buffer film is formed from AlN, and the thickness thereof is regulated to 150 Å or less.

In the present invention, by virtue of the presence of the buffer film, a Group III nitride semiconductor is grown not on the flat surface of the growth substrate, but on the side surfaces of the groove in a lateral direction.

The following description is common to the first and second aspects of the present invention.

As used herein, "Group III nitride semiconductor" encompasses a semiconductor represented by the formula $Al_xGa_yIn_zN$ ($x+y+z=1$, $0 \leq x, y, z \leq 1$); such a semiconductor doped with an impurity so as to attain, for example, an n-type conduction or a p-type conduction; as well as such a semiconductor in which a portion of Al, Ga, or In is substituted by another Group 13 element (i.e., B or Tl), or a portion of N is substituted by another Group 15 element (i.e., P, As, Sb, or Bi). Specific examples of the Group III nitride semiconductor include GaN, AlN, InN, InGaN, AlGaN, AlInN, and AlGaInN. Si is employed as an n-type impurity, and Mg is employed as a p-type impurity.

As used herein, "side surfaces of a groove" refers to, among surfaces exposed through formation of a groove in the growth substrate, surfaces which are not parallel to the main surface of the growth substrate.

The growth substrate may be formed of a hexagonal material such as sapphire, SiC, Si, GaAs, ZnO, or spinel. However, a sapphire substrate is preferably employed, from the viewpoints of, for example, easy availability and lattice matching with a Group III nitride semiconductor.

Grooves formed in a surface of the growth substrate may be arranged in any pattern as viewed from above; for example, a stripe pattern, a grid pattern, or a hexagonal, triangular, or circular dot pattern. The cross section of each groove as viewed in a vertical direction of the growth substrate may have any form (e.g., a rectangular form, a trapezoidal form, or a wedge-like form), which may vary with the crystal orientation of the main surface of a Group III nitride semiconductor of interest.

The growth temperature is preferably lower than a temperature at which the Group III nitride semiconductor is epitaxially grown on a planar growth substrate uniformly in a direction perpendicular to the growth substrate.

The growth substrate employed is preferably a sapphire substrate. In such a case, preferably, the angle between c-plane or a-plane of sapphire and side surfaces of a groove on which a Group III nitride semiconductor is grown is reduced to a minimum possible level. This is because, the smaller the aforementioned angle, the more easily a Group III nitride semiconductor is grown in a c-axis direction. In other words, a Group III nitride semiconductor is difficult to grow on side surfaces which form a large angle with c-plane or a-plane of sapphire. Most preferably, side surfaces of a groove on which a Group III nitride semiconductor is grown assume a c-plane or a-plane.

Preferably, at least one of side surfaces of a groove assumes a c-plane of sapphire, and a Group III nitride semiconductor is epitaxially grown on the side surface(s) which assumes (assume) a c-plane of sapphire. The growth substrate employed may be a sapphire substrate having an a-plane main surface. Alternatively, the growth substrate may be a sapphire substrate having an m-plane main surface. In such a case, preferably, grooves are formed in a stripe pattern so that the longitudinal side surfaces thereof assume a c-plane of sapphire.

Also, preferably, at least one of side surfaces of a groove formed in the growth substrate is a-plane of sapphire, and a Group III nitride semiconductor is epitaxially grown primarily on the side surface(s) which assumes (assume) an a-plane of sapphire. In this case, the main surface of the growth substrate is preferably c-plane. Preferably, grooves are formed in a stripe pattern so that the longitudinal side surfaces thereof are a-plane of sapphire.

For formation of grooves, dry etching (e.g., ICP etching) may be employed.

In a third aspect of the present invention, there is provided a template substrate comprising:

a sapphire substrate having an a-plane main surface and having a groove formed in the surface; and a Group III nitride semiconductor layer formed on the surface of the sapphire substrate, wherein at least one surface of the groove assumes a c-plane of sapphire, and the Group III nitride semiconductor layer has an m-plane main surface.

According to the third aspect of the present invention, the Group III nitride semiconductor layer is grown in a direction perpendicular to the side surface(s) of the groove (i.e., c-plane of sapphire); i.e., the layer is grown in an c-axis direction. Since the main surface of the sapphire substrate is a-plane, the main surface of the Group III nitride semiconductor layer parallel to the growth direction assumes an m-plane.

In a fourth aspect of the present invention, there is provided a template substrate comprising:

a sapphire substrate having an m-plane main surface and having a groove formed in the surface; and a Group III nitride semiconductor layer formed on the surface of the sapphire substrate, wherein at least one surface of the groove assumes a c-plane of sapphire, and the Group III nitride semiconductor layer has an a-plane main surface.

According to the fourth aspect of the present invention, the Group III nitride semiconductor layer is grown in a direction perpendicular to the side surface(s) of the groove (i.e., c-plane of sapphire); i.e., the layer is grown in an c-axis direction. Since the main surface of the sapphire substrate assumes an m-plane, the main surface of the Group III nitride semiconductor layer parallel to the growth direction is a-plane.

In a fifth aspect of the present invention, there is provided a template substrate comprising:

a sapphire substrate having a c-plane main surface and having a groove formed in the surface; and a Group III nitride semiconductor layer formed on the surface of the sapphire substrate, wherein at least one surface of the groove is a-plane of sapphire, and the Group III nitride semiconductor layer has an a-plane main surface.

According to the fifth aspect of the present invention, the Group III nitride semiconductor layer is grown in a direction perpendicular to the side surface(s) of the groove (i.e., a-plane of sapphire); i.e., the layer is grown in an c-axis direction. Since the main surface of the sapphire substrate assumes a c-plane, the main surface of the Group III nitride semiconductor layer parallel to the growth direction is a-plane.

A sixth aspect of the present invention is drawn to a specific embodiment of the template substrate according to the third, fourth, or fifth aspect, which further comprises, between the sapphire substrate and the Group III nitride semiconductor layer, a buffer film formed so as to cover the surface of the sapphire substrate, the side surfaces of the groove, and the bottom surface of the groove, wherein the Group III nitride semiconductor layer is formed, via the buffer film, on the surface of the sapphire substrate.

In the third or fourth aspect of the present invention, preferably, the groove is formed in a stripe pattern such that the groove has a longitudinal side surface which assumes a c-plane of sapphire.

In the fifth aspect of the present invention, preferably, the groove is formed in a stripe pattern such that the groove has a longitudinal side surface which is a-plane of sapphire.

Preferred modes described in the first and second aspects of the present invention may be applied to the third to sixth aspects of the present invention. Preferred modes (regarding the buffer film) described in the second aspect may be applied to the sixth aspect.

According to the first aspect of the present invention, a Group III nitride semiconductor can be epitaxially grown on the side surfaces of a groove formed in a growth substrate in a direction parallel to the main surface of the growth substrate. Therefore, a high-quality Group III nitride semiconductor whose main surface is a non-polar plane or a semi-polar plane can be formed. Since the method according to the first aspect does not include a step of restoring etching damage through thermal treatment or a similar treatment of the growth substrate, the production process is simplified, and excellent mass productivity is achieved. The crystal orientation of the main surface of a Group III nitride semiconductor formed depends on, for example, the crystal structure or lattice constant of the growth substrate, the crystal orientation of the main surface of the growth substrate, or the crystal orientation of the side surfaces of the groove. In the case where, for example, the growth substrate is a sapphire substrate, when the main surface of the substrate is a-plane, and the side surfaces of the groove assume a c-plane, a Group III nitride semiconductor having an m-plane main surface can be produced, whereas when the main surface of the substrate assumes an en-plane, and the side surfaces of the groove assume a c-plane, a Group III nitride semiconductor having an a-plane main surface can be produced.

According to the second aspect of the present invention, a buffer film is provided through sputtering without provision of a mask used in a well-known ELO technique, and a Group III nitride semiconductor is epitaxially grown on the side surfaces of a groove formed in a growth substrate in a direction parallel to the main surface of the growth substrate. Therefore, a high-quality Group III nitride semiconductor whose main surface is a non-polar plane or a semi-polar plane can be formed. Since the buffer film is formed through sputtering, the film exhibits reliable characteristics. Thus, a Group III nitride semiconductor whose main surface is a non-polar plane or a semi-polar plane can be formed with high reproducibility, and excellent mass productivity is achieved. Since the method according to the second aspect does not include a step of restoring etching damage through thermal treatment or a similar treatment of the growth substrate, a Group III nitride semiconductor whose main surface is a non-polar plane or a semi-polar plane can be formed through a simple process. The crystal orientation of the main surface of a Group III nitride semiconductor formed depends on, for example, the crystal structure or lattice constant of the growth substrate, the crystal orientation of the main surface of the growth substrate, or the crystal orientation of the side surfaces of the groove. In the case where, for example, the growth substrate is a sapphire substrate, when the main surface of the substrate is a-plane, and the side surfaces of the groove assume a c-plane, a Group III nitride semiconductor having an m-plane main surface can be produced, whereas when the main surface of the substrate assumes an m-plane, and the side surfaces of the groove assume a c-plane, a Group III nitride semiconductor having an a-plane main surface can be produced.

When the growth temperature is regulated to be lower than a temperature at which the Group III nitride semiconductor is epitaxially grown on a planar growth substrate uniformly in a direction perpendicular to the growth substrate, the Group III nitride semiconductor can be epitaxially grown on the side surfaces of the groove formed in the growth substrate primarily in a direction parallel to the main surface of the growth substrate. That is, the growth rate in a direction perpendicular to the side surfaces of the groove can be controlled to be higher than that in a direction perpendicular to the main surface of the growth substrate.

When the thickness of the buffer film is regulated to be smaller than that of a buffer film which is employed for epitaxially growing the Group III nitride semiconductor on a planar growth substrate uniformly in a direction perpendicular to the growth substrate, and when the growth temperature is regulated to be lower than a temperature at which the Group III nitride semiconductor is epitaxially grown on a planar growth substrate uniformly in a direction perpendicular to the growth substrate, the Group III nitride semiconductor can be epitaxially grown on the side surfaces of the groove formed in the growth substrate primarily in a direction parallel to the main surface of the growth substrate. That is, the growth rate in a direction perpendicular to the side surfaces of the groove can be controlled to be higher than that in a direction perpendicular to the main surface of the growth substrate.

The buffer film may be formed of $Al_xGa_{1-x}N$ or AlN. When an AlN buffer film having a thickness of 150 Å or less is provided, there can be produced a Group III nitride semiconductor whose main surface is a non-polar plane or a semi-polar plane and which exhibits further excellent crystallinity and surface flatness.

Since the growth substrate can be formed of sapphire, there can be produced, at low cost, a Group III nitride semiconductor whose main surface is a non-polar plane or semi-polar plane and has a large area.

Since a Group III nitride semiconductor crystal is likely to grow on c-plane or a-plane of sapphire, when the side surfaces of the groove assume a c-plane or a-plane, a Group III nitride semiconductor whose main surface is a non-polar plane or a semi-polar plane and which exhibits good crystallinity can be effectively produced.

When the growth substrate is a sapphire substrate having an a-plane main surface, and a Group III nitride semiconductor is epitaxially grown on the c-plane side surfaces of the groove in a c-axis direction, the thus-produced Group III nitride semiconductor has an m-plane main surface. In contrast, when the growth substrate is a sapphire substrate having an m-plane main surface, and a Group III nitride semiconductor is epitaxially grown on the c-plane side surfaces of the groove in a c-axis direction, a Group III nitride semiconductor having an a-plane main surface can be produced.

When a stripe-pattern groove whose longitudinal side surfaces assume a c-plane of sapphire is provided, there can be produced a Group III nitride semiconductor whose main surface is a non-polar plane or a semi-polar plane and which exhibits excellent crystallinity and surface flatness.

The growth temperature of the Group III nitride semiconductor is preferably 1,020 to 1,100° C. When the growth temperature falls within such a range, a Group III nitride semiconductor can be grown on the side surfaces of the groove predominantly in a c-axis direction, and the crystallinity and surface flatness of the produced Group III nitride semiconductor can be enhanced.

When the growth substrate is a sapphire substrate having a c-plane main surface, and a Group III nitride semiconductor is epitaxially grown on the a-plane side surfaces of the groove in a c-axis direction, a Group III nitride semiconductor having an a-plane main surface can be produced.

When a stripe-pattern groove whose longitudinal side surfaces are a-plane of sapphire is provided, there can be produced a Group III nitride semiconductor whose main surface is a non-polar plane or a semi-polar plane and which exhibits excellent crystallinity and surface flatness.

The method of the present invention may employ dry etching. The growth substrate can be effectively etched by means of ICP etching.

In the template substrate according to any of the third to sixth aspects of the present invention, the Group III nitride semiconductor layer exhibits excellent crystallinity and surface flatness. When a semiconductor device is produced by stacking a Group III nitride semiconductor layer on the template substrate, the resultant semiconductor device is not affected by a piezoelectric field.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Embodiment 1 corresponds to a method for producing a GaN template substrate having an m-plane main surface. Steps of the production method will now be described with reference to FIGS. 1A to 1C.
(Groove Formation Step)

Figure 1A:
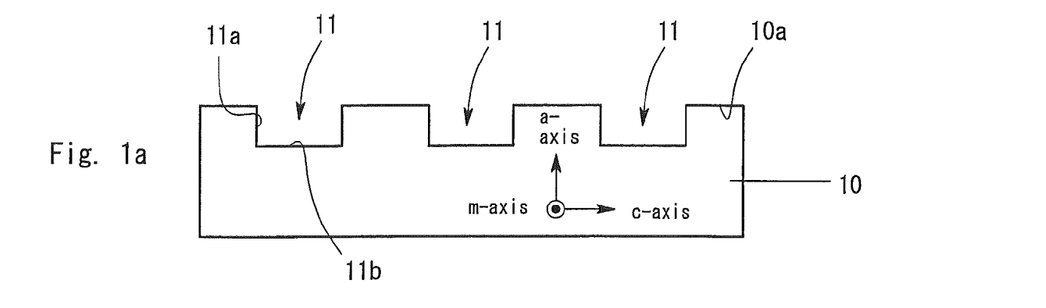
FIGS. 1A to 1C are sketches showing a process for producing a GaN template substrate according to Embodiment 1.

Firstly, a surface 10a of a sapphire substrate 10 having an a-plane main surface (corresponding to the growth substrate of the present invention) is subjected to ICP etching by use of a mask, to thereby form stripe-pattern grooves 11 whose longitudinal direction is parallel to the m-axis direction of the sapphire substrate 10 (FIG. 1A). The cross section of each groove 11 parallel to the c-axis assumes a rectangular form. C-plane surfaces of the sapphire substrate are exposed at the side surfaces 11a of each groove 11, and an a-plane surface of the sapphire substrate is exposed at the bottom surface 11b of the groove 11.

In general, after formation of the grooves 11, the sapphire substrate 10 is heated to 1,000° C. or higher for restoring damage to the sapphire substrate 10 caused by ICP etching. In contrast, in Embodiment 1, the substrate 10 is not subjected to such a thermal treatment for restoring damage thereto, and thus the substrate 10 remains to have damage to the side surfaces 11a and the bottom surfaces 11b of the grooves 11 caused by ICP etching.

(Heating Step)

Subsequently, the sapphire substrate 10 is placed into an MOCVD apparatus and heated to a growth temperature in an atmosphere containing hydrogen and ammonia.

(Crystal Growth Step)

Then, TMG (trimethylgallium) is introduced into the MOCVD apparatus, and GaN crystal 13 is epitaxially grown on the side surfaces 11a of each groove 11. GaN crystal 13 is grown so that the c-axis direction of the sapphire substrate 10 coincides with the c-axis direction of the GaN crystal 13. Regarding the polarity of the c-axis direction of the GaN crystal 13, the −c direction of GaN corresponds to the direction from the side surfaces 11a of the groove 11 toward the inside (center) of the groove 11. That is, growth of GaN proceeds in a −c-axis direction (i.e., in a direction perpendicular to the side surfaces 11a), and the growth surface thereof assumes a −c-plane.

In this case, the temperature for the growth of GaN crystal 13 is regulated so that GaN crystal 13 is not grown on the surface 10a of the sapphire substrate 10 or the bottom surfaces 11b of the grooves 11, and that growth of GaN crystal 13 on the side surfaces 11a of the grooves 11 proceeds predominantly in a c-axis direction. For example, the growth temperature of GaN crystal 13 is regulated to be lower than a temperature at which, generally, GaN is epitaxially grown on a flat growth substrate in a direction perpendicular to the substrate. The temperature at which, generally, GaN is epitaxially grown on a flat growth substrate in a direction perpendicular to the substrate is higher than 1,100° C. Therefore, when the GaN growth temperature is regulated to 1,100° C. or lower, crystal growth can be controlled so that GaN crystal 13 is not grown on the surface 10a of the sapphire substrate 10 or the bottom surfaces 11b of the grooves 11, and that growth of GaN crystal 13 on the side surfaces 11a of the grooves 11 proceeds predominantly in a c-axis direction.

Figure 1B:
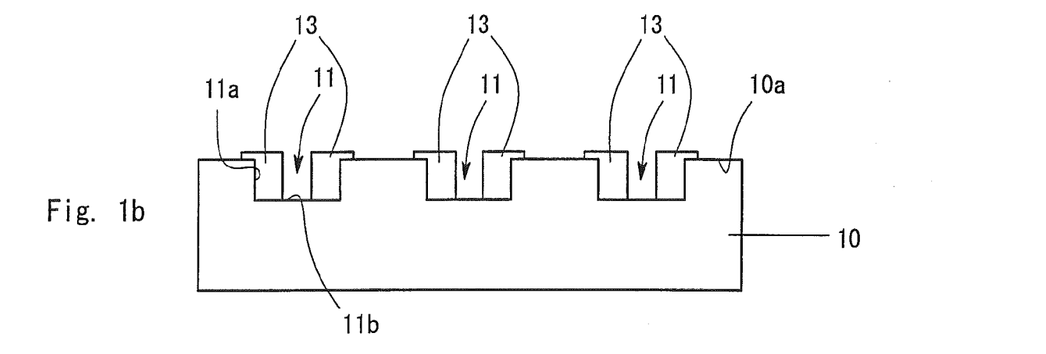
Figure 1C:
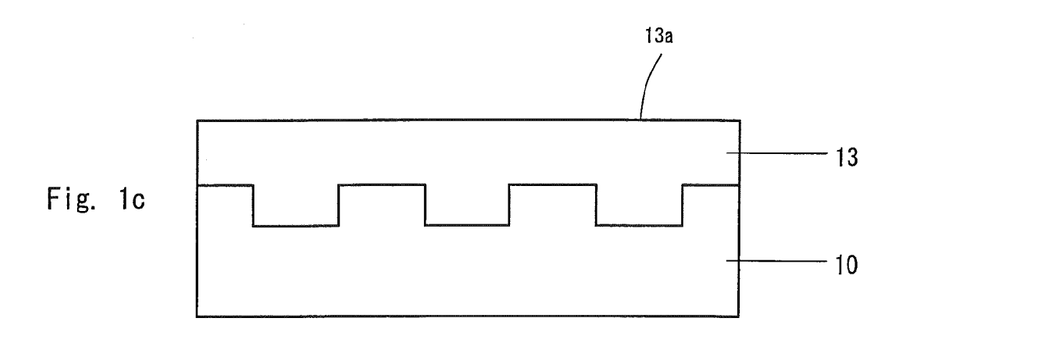

When GaN crystal 13 is grown as described above, growth of GaN crystal 13 proceeds rapidly toward the inside of each groove 11 in a c-axis direction (−c direction); i.e., in a direction horizontal to the sapphire substrate 10, and also proceeds gradually in a direction perpendicular to the sapphire substrate 10 (FIG. 1B). When crystal growth proceeds further, the grooves 11 are filled with GaN, and the surface 10a of the sapphire substrate 10 is gradually covered with GaN through crystal growth in directions horizontal to the sapphire substrate 10 (i.e., both −c direction and +c direction). Finally, a flat GaN crystal layer 13 is formed on the sapphire substrate 10 (FIG. 1C). The thus-formed GaN crystal 13 has an m-plane main surface, since the side surfaces 11a of the grooves 11 of the sapphire substrate 10 assume a c-plane. This is attributed to, for example, the difference in lattice constant between GaN and sapphire.

As described above, the GaN template substrate production method of Embodiment 1 produces GaN crystal 13 having an m-plane main surface and exhibiting good crystallinity and surface flatness. Conceivable reasons therefor will be described below. Conceivably, damage to the sapphire substrate caused by ICP etching prevents growth of GaN crystal having a c-plane main surface on the sapphire substrate having an a-plane main surface. Also, conceivably, when the growth temperature of GaN crystal 13 is regulated to an appropriate value, GaN crystal 13 is not grown on the surface 10a of the sapphire substrate 10 or the bottom surfaces 11b of the grooves 11 (i.e., GaN crystal 13 is epitaxially grown only on the side surfaces 11a of the grooves 11), and growth of GaN crystal 13 proceeds predominantly in a c-axis direction; i.e., in a direction horizontal to the sapphire substrate 10. In this case, the surface of the GaN crystal 13 parallel to the sapphire substrate 10 assumes an m-plane, which is attributed to, for example, lattice matching between sapphire and GaN. Also, conceivably, an AlN film is formed through nitridation of sapphire in the heating step, and the AlN film serves as a buffer for facilitating epitaxial growth of GaN on the side surfaces 11a of the grooves 11. For these reasons, the GaN crystal 13 does not contain a crystal having a c-plane surface parallel to the sapphire substrate 10, and has an m-plane main surface. Since growth of GaN crystal 13 proceeds predominantly in a direction horizontal to the sapphire substrate 10, the GaN crystal 13 can rapidly cover the surface 10a of the sapphire substrate 10, and the surface 13a of the GaN crystal 13 becomes flat.

Dependencies, on various factors, of the crystallinity of GaN crystal 13 and the flatness of the surface 13a were investigated by the following experiments.

Figure 2:
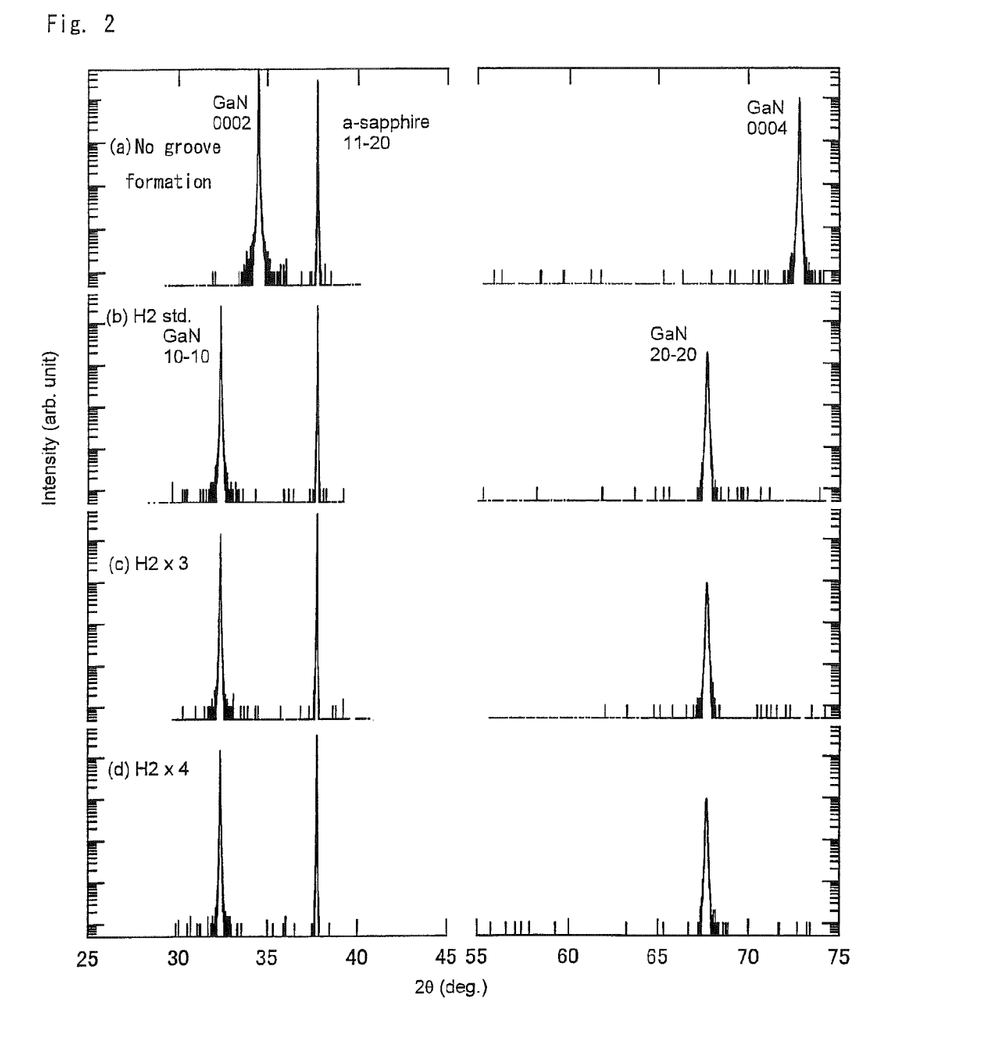
FIG. 2 shows the results of X-ray diffractometry of surfaces of GaN crystals 13.

FIG. 2 shows the results of X-ray diffractometry of a surface 13a of GaN crystal 13 grown at 1,040° C. on a sapphire substrate 10 having an a-plane main surface (diameter: 3 inches) and having grooves 11 (width: 1.5 μm, depth: 0.7 μm, interval: 1.5 μm). For comparison, FIG. 2 also shows the results corresponding to the case where a sapphire substrate 10 having no groove was employed. In this experiment, hydrogen flow rate in the heating step was regulated to a standard rate (i.e., hydrogen flow rate in the case where GaN crystal is grown on a flat sapphire substrate uniformly in a vertical direction), or regulated to be thrice or four times the standard rate. As shown in FIG. 2, when the sapphire substrate 10 having no groove 11 was employed, peaks attributed to (0002) plane and (0004) plane (both assume a c-plane) were observed, but no peak attributed to m-plane was observed; i.e., GaN crystal having an m-plane main surface was not produced. In contrast, when GaN crystal 13 was formed through the method described in Embodiment 1, regardless of hydrogen flow rate, peaks attributed to (10-10) plane and (20-20) plane (both assume an m-plane) were observed, but no peak attributed to c-plane or a-plane was observed. These data indicate that the GaN crystal 13 formed through the method described in Embodiment 1 has an m-plane main surface and exhibits high crystallinity.

Figure 3:
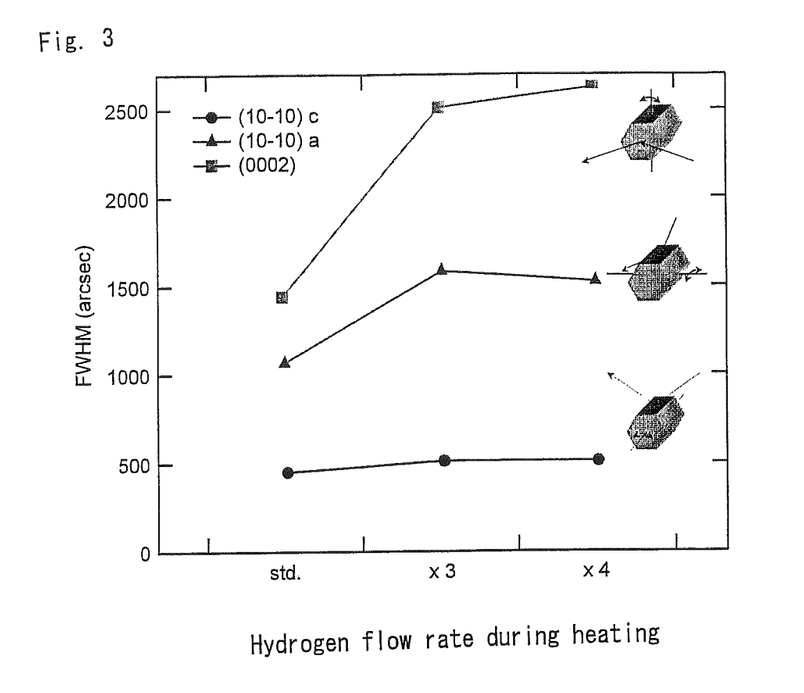
FIG. 3 is a graph showing the relationship between hydrogen flow rate in a heating step and X-ray rocking curve half width.

FIG. 3 is a graph showing the relationship between hydrogen flow rate in the heating step and X-ray rocking curve half width in the c-plane or m-plane of GaN crystal 13. The sizes of the sapphire substrate 10 and the grooves 11, and the growth temperature of GaN crystal 13 were the same as those in the experiment whose results are shown in FIG. 2. Hydrogen flow rate in the heating step was varied in the same manner as in the case of the experiment whose results are shown in FIG. 2. For obtaining data corresponding to m-plane, the X-ray rocking curve half widths in c-axis and a-axis directions of m-plane of a sample were determined by rotating the sample about both the a-axis and the c-axis. In the plotted data of X-ray rocking curve half width shown in FIG. 3, squares, triangles, and circles correspond to c-plane, c-axis direction of m-plane, and a-axis direction of m-plane, respectively.

As shown in FIG. 3, the X-ray rocking curve half width in a c-axis direction of m-plane was about 1,000 arcsec (hydrogen flow rate: the standard rate) or about 1,500 arcsec (hydrogen flow rate: thrice or four times the standard rate). Thus, the crystal orientation in a c-axis direction of m-plane was high when hydrogen flow rate was the standard rate. The X-ray rocking curve half width in an a-axis direction of m-plane was about 500 arcsec at any of the aforementioned hydrogen flow rates; i.e., the crystal orientation in an a-axis direction of m-plane was high, regardless of hydrogen flow rate. The X-ray rocking curve half width in the c-plane was about 1,500 arcsec (hydrogen flow rate: the standard rate) or about 2,500 arcsec (hydrogen flow rate: thrice or four times the standard rate). Thus, the crystal orientation in the c-plane was high when hydrogen flow rate was the standard rate.

As is clear from the data shown in FIGS. 2 and 3, the GaN crystal 13 exhibits the most excellent crystallinity when hydrogen flow rate is adjusted to the standard rate. In this case, the hydrogen content of a hydrogen-ammonia mixture atmosphere is about 50%.

Figure 4:
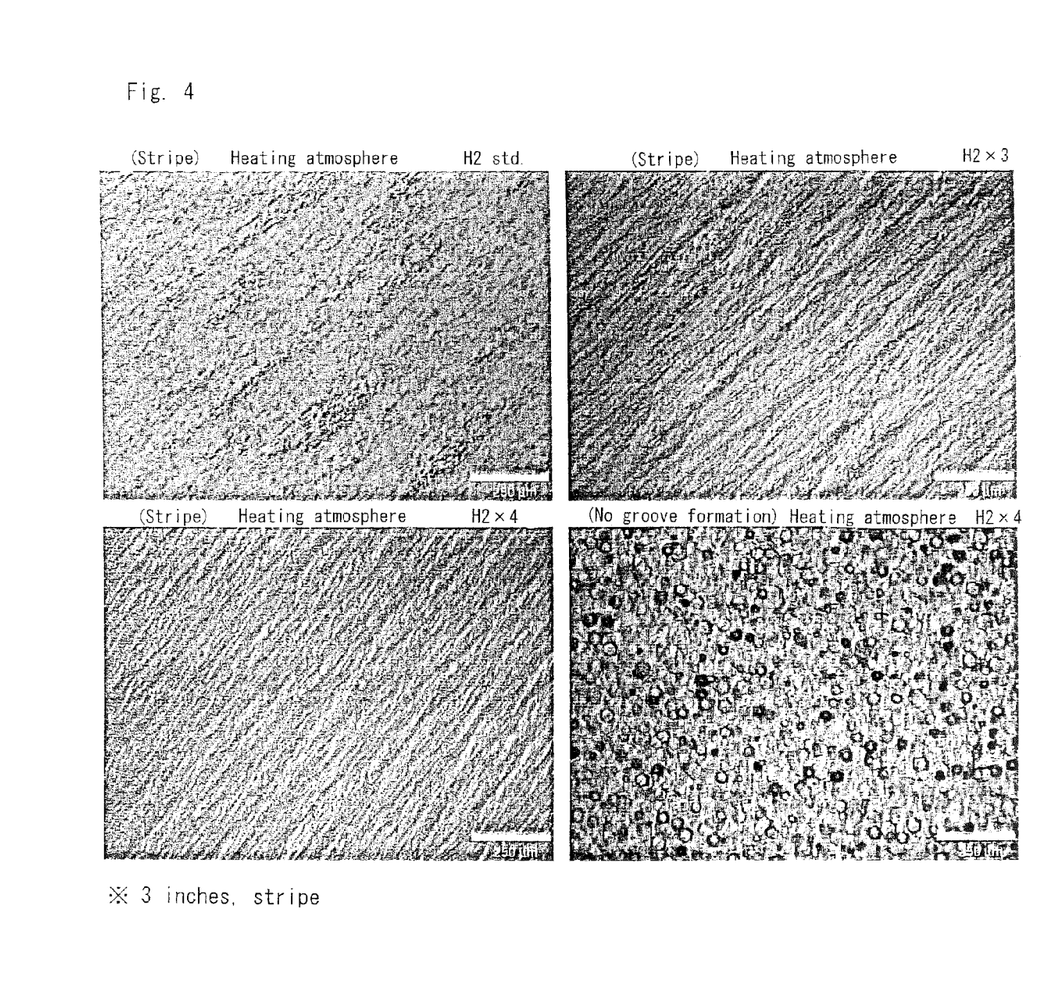
FIG. 4 is photographs showing surfaces of GaN crystals 13.

FIG. 4 shows photographs of the surfaces of GaN crystals 13 corresponding to the cases where hydrogen flow rate was the standard rate, thrice the standard rate, and four times the standard rate. For comparison, FIG. 4 also shows a photograph of the surface of GaN crystal 13 grown on a sapphire substrate 10 having no groove 11. The sizes of the sapphire substrate 10 and the grooves 11, and the growth temperature of GaN crystal 13 were the same as those in the experiment whose results are shown in FIG. 2 or 3. As is clear from FIG. 4, when hydrogen flow rate is the standard rate, high surface flatness is achieved, as compared with the case where hydrogen flow rate is thrice or four times the standard rate. In contrast, when GaN crystal is grown on the sapphire substrate 10 having no groove 11, numerous hexagonal microirregularities are formed on the surface of the GaN crystal; i.e., the GaN crystal exhibits poor surface flatness.

GaN crystals 13 were grown at different growth temperatures, and the surfaces 13a of the thus-grown GaN crystals 13 were observed. The GaN crystals grown at 1,020 to 1,060° C. exhibited high surface flatness. Particularly, the GaN crystals grown at 1,030 to 1,050° C. exhibited higher surface flatness. The GaN crystal grown at 1,040° C. exhibited the most excellent surface flatness.

In Embodiment 1, a sapphire substrate is employed as the growth substrate. However, the growth substrate may be, instead of a sapphire substrate, a substrate formed of a hexagonal material such as SiC, Si, GaAs, ZnO, or spinel. In Embodiment 1, ICP etching is employed for forming grooves in the growth substrate. However, another dry etching technique may be employed.

Embodiment 1 corresponds to a method for producing a GaN template substrate. However, the present invention is not limited to GaN, but is applicable to a Group III nitride semiconductor such as AlN, AlGaN, InGaN, AlInN, or AlGaInN. The present invention is not limited to the production of such a Group III nitride semiconductor described in Embodiment 1 (i.e., Group III nitride semiconductor having an m-plane main surface), and can produce a Group III nitride semiconductor whose main surface is any non-polar plane or semi-polar plane, in consideration of the crystal orientation of the main surface of the growth substrate employed, the crystal orientation of the side surfaces of grooves formed in the growth substrate, and the lattice constant of the growth substrate. For example, when a sapphire substrate having an m-plane main surface is employed, and grooves are formed so that the side surfaces thereof assume a c-plane, a Group III nitride semiconductor having an a-plane main surface can be produced. Also, when a sapphire substrate having a c-plane main surface is employed, and grooves are formed so that the side surfaces thereof are a-plane, a Group III nitride semiconductor having an a-plane main surface can be produced.

In Embodiment 1, grooves are formed so that they are arranged in a stripe pattern as viewed from above. However, grooves may be formed in any pattern; for example, a grid pattern or a dot pattern. Since a Group III nitride semiconductor has polarity particularly in a c-axis direction, when the side surfaces of a groove have different crystal orientations, GaN crystal having different polarity directions is grown. Therefore, when grooves are formed in such a pattern that the side surfaces of each groove have many different crystal orientations, a Group III nitride semiconductor crystal having many different polarity directions is produced, which is not preferred. From such a viewpoint, stripe-pattern grooves are more advantageous than grooves formed in another pattern, since each stripe-pattern groove has only two side surfaces, and a Group III nitride semiconductor grown on the side surfaces exhibits polarity in only two directions. Stripe-pattern grooves are also advantageous in that the side surfaces of each groove have a large area, and thus the crystallinity and surface flatness of a Group III nitride semiconductor grown on the side surfaces are higher than those of a Group III nitride semiconductor grown on the side surfaces of grooves formed in another pattern.

In order to avoid growth of a crystal having different polarity directions, some of side surfaces of grooves may be covered with, for example, a mask, so that a Group III nitride semiconductor crystal is not grown on the thus-covered side surfaces. For example, when grooves are formed in a stripe pattern, and one of two side surfaces of each groove is covered with a mask so that a Group III nitride semiconductor is grown only on the other side surface, the resultant Group III nitride semiconductor exhibits polarity only in one direction; i.e., the semiconductor exhibits good quality.

Alternatively, in order to avoid growth of a crystal having different polarity directions, side surfaces of grooves may be inclined so that the side surfaces exhibits a crystal orientation in which crystal growth is less likely to occur. When, for example, a sapphire substrate is employed as a growth substrate, the smaller the angle between the side surfaces of grooves formed in the substrate and the c-plane or a-plane of sapphire, the more likely a crystal is grown on the side surfaces. In this case, when the side surfaces of the grooves assume a c-plane or a-plane, a crystal is most likely to grow on the side surfaces. Therefore, when, for example, side surfaces of grooves on which a Group III nitride semiconductor crystal is grown assume a c-plane, and the other groove side surfaces on which no crystal growth is desired are inclined with respect to c-plane, growth of a crystal having different polarity directions can be avoided.

Embodiment 2

Similar to the case of Embodiment 1, Embodiment 2 corresponds to a method for producing a GaN template substrate having an m-plane main surface. Steps of the production method will next be described with reference to FIGS. 5A to 5D.

(Groove Formation Step)

Figure 5A:
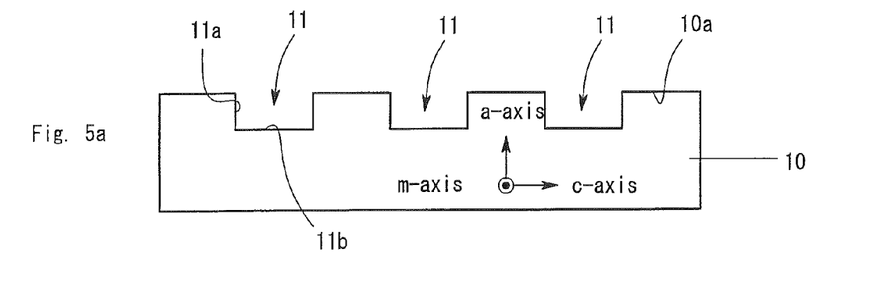
FIGS. 5A to 5D are sketches showing a process for producing a GaN template substrate according to Embodiment 2.

Firstly, a surface 10a of a sapphire substrate 10 having an a-plane main surface (corresponding to the growth substrate of the present invention) is subjected to ICP etching by use of a mask, to thereby form stripe-pattern grooves 11 whose longitudinal direction is parallel to the m-axis direction of the sapphire substrate 10 (FIG. 5A). The cross section of each groove 11 parallel to the c-axis assumes a rectangular form. C-plane surfaces of the sapphire substrate are exposed at the side surfaces 11a of each groove 11, and an a-plane surface of the sapphire substrate is exposed at the bottom surface 11b of the groove 11.

(Buffer Film Formation Step)

Figure 5B:
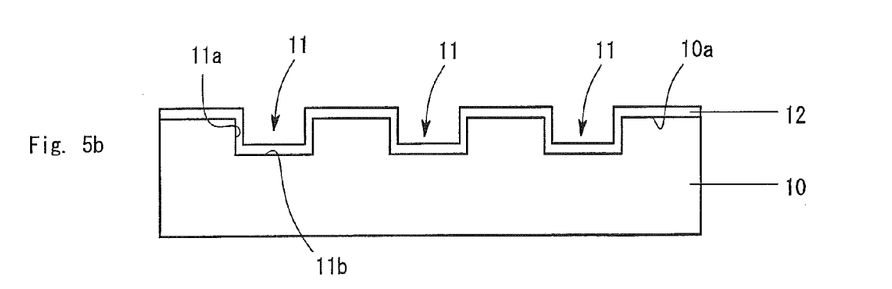

Subsequently, the sapphire substrate 10 having the thus-formed grooves is introduced into a reactive magnetron sputtering apparatus, and an AlN film 12 (corresponding to the buffer film of the present invention) is formed at 500° C. (FIG. 5B). In this case, the AlN film 12 is formed not only on the surface 10a of the sapphire substrate 10, but also on the side surfaces 11a and the bottom surfaces 11b of the grooves 11. It was observed that the thickness of a portion of the AlN film 12 formed on the side surfaces 11a of the grooves 11 is smaller than that of a portion of the AlN film 12 formed on the surface 10a of the sapphire substrate 10 and on the bottom surfaces 11b of the grooves 11. As used herein, "the thickness of the AlN film 12" refers to the thickness of a portion of the AlN film 12 formed on the surface 10a of the sapphire substrate 10.

In general, before formation of the AlN film 12, the sapphire substrate 10 is heated to 1,000° C. or higher for restoring damage to the sapphire substrate 10 caused by ICP etching. In contrast, in Embodiment 2, the substrate 10 is not subjected to such a thermal treatment for restoring damage thereto, and the AlN film 12 is formed, with the substrate 10 having damage to the side surfaces 11a and the bottom surfaces 11b of the grooves 11 caused by ICP etching.

(Heating Step)

Subsequently, the sapphire substrate 10 having the thus-formed AlN film 12 is placed into an MOCVD apparatus and heated to a growth temperature in an atmosphere containing hydrogen and ammonia.

(Crystal Growth Step)

Then, TMG (trimethylgallium) is introduced into the MOCVD apparatus, and GaN crystal 13 is epitaxially grown on the side surfaces 11a of each groove 11. GaN crystal 13 is grown so that the c-axis direction of the sapphire substrate 10 coincides with the c-axis direction of the GaN crystal 13. Regarding the polarity of the c-axis direction of the GaN crystal 13, −c direction corresponds to the direction from the side surfaces 11a of the groove 11 toward the inside (center) of the groove 11. That is, growth of GaN proceeds in a −c-axis direction (i.e., in a direction perpendicular to the side surfaces 11a), and the growth surface thereof assumes a −c-plane.

In this case, the thickness of the AlN film 12 and the growth temperature of GaN crystal 13 are regulated so that GaN crystal 13 is not grown on the surface 10a of the sapphire substrate 10 or the bottom surfaces 11b of the grooves 11, and that growth of GaN crystal 13 on the side surfaces 11a of the grooves 11 proceeds predominantly in a c-axis direction. For example, the thickness of the AlN film 12 is regulated to be smaller than the minimum thickness of an AlN film which is provided between a sapphire substrate and GaN when GaN is epitaxially grown evenly in a c-axis direction of GaN (i.e., in a direction perpendicular to the main surface of the sapphire substrate). Also, the growth temperature of GaN crystal 13 is regulated to be lower than a temperature at which, generally, GaN is epitaxially grown on a growth substrate in a c-axis-direction (i.e., in a direction perpendicular to the main surface of the substrate). Generally, an AlN film having such a minimum thickness (150 to 200 Å) is formed through sputtering for 40 seconds. The temperature at which, generally, GaN is epitaxially grown on a sapphire substrate in a c-axis direction (i.e., in a direction perpendicular to the main surface of the substrate) is higher than 1,100° C. Therefore, when the thickness of the AlN film 12 is regulated to 150 Å or less, and the GaN growth temperature is regulated to 1,100° C. or lower, crystal growth can be controlled so that GaN crystal 13 is not grown on the surface 10a of the sapphire substrate 10 or the bottom surfaces 11b of the grooves 11, and that growth of GaN crystal 13 on the side surfaces 11a of the grooves 11 proceeds predominantly in a c-axis direction.

Figure 5C:
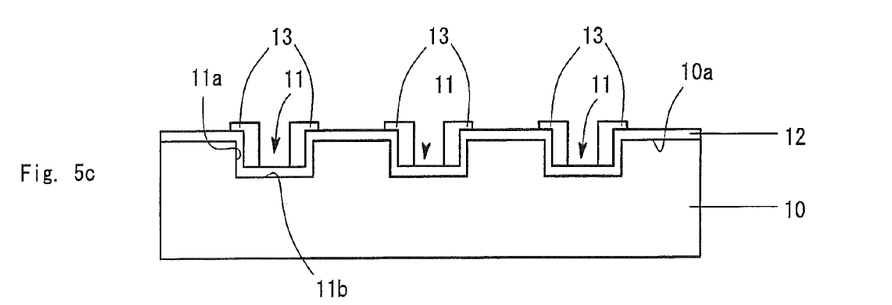
Figure 5D:
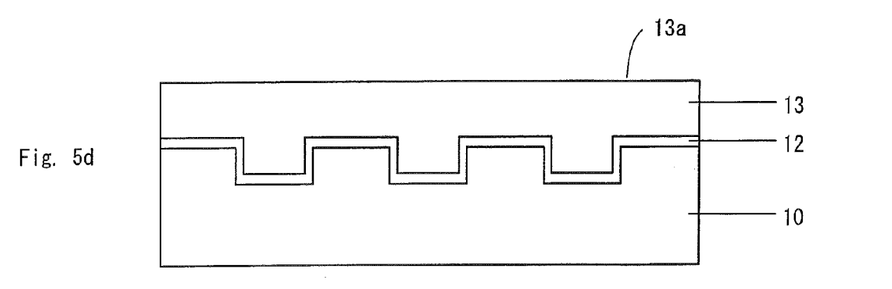

When GaN crystal 13 is grown as described above, growth of GaN crystal 13 proceeds rapidly toward the inside of each groove 11 in a c-axis direction (−c direction); i.e., in a direction horizontal to the sapphire substrate 10, and also proceeds gradually in a direction perpendicular to the sapphire substrate 10 (FIG. 5C). When crystal growth proceeds further, the grooves 11 are filled with GaN, and the surface 10a of the sapphire substrate 10 is gradually covered with GaN through crystal growth in directions horizontal to the sapphire substrate 10 (i.e., both −c direction and +c direction). Finally, the flat GaN crystal 13 is formed on the sapphire substrate 10 (FIG. 5D). The thus-formed GaN crystal 13 has an m-plane main surface, since the side surfaces 11a of the grooves 11 of the sapphire substrate 10 assume a c-plane. This is attributed to, for example, the difference in lattice constant between GaN and sapphire.

As described above, the GaN template substrate production method of Embodiment 2 produces GaN crystal 13 having an m-plane main surface and exhibiting good crystallinity and surface flatness. Conceivable reasons therefor will be described below. The present inventors executed ICP etching of an a-plane main surface of a sapphire substrate without grooves; formed an AlN film through sputtering without restoring damage to the sapphire substrate caused by ICP etching; and grew a GaN crystal on the AlN film. As a result, a flat GaN crystal having a c-plane main surface failed to be formed on the sapphire substrate having an a-plane main surface. Therefore, conceivably, damage to the sapphire substrate caused by ICP etching prevents growth of a GaN crystal having a c-plane main surface on the sapphire substrate having an a-plane main surface. Also, conceivably, when the thickness of the AlN film 12 or the growth temperature of GaN crystal 13 is regulated to an appropriate value, GaN crystal 13 is not grown on the surface 10a of the sapphire substrate 10 or the bottom surfaces 11b of the grooves 11 (i.e., GaN crystal 13 is epitaxially grown only on the side surfaces 11a of the grooves 11), and growth of GaN crystal 13 proceeds predominantly in a c-axis direction; i.e., in a direction horizontal to the sapphire substrate 10. In this case, the surface of the GaN crystal 13 parallel to the sapphire substrate 10 assumes an m-plane, which is attributed to, for example, lattice matching between sapphire and GaN. For these two reasons, the GaN crystal 13 does not contain a crystal having a c-plane surface parallel to the main surface of the sapphire substrate 10, and has an m-plane main surface. Since growth of GaN crystal 13 proceeds predominantly in a direction horizontal to the sapphire substrate 10, the GaN crystal 13 can rapidly cover the surface 10a of the sapphire substrate 10, and the surface 13a of the GaN crystal 13 becomes flat.

Dependency of the crystallinity of GaN crystal 13 and the flatness of the surface 13a was evaluated by the following experiments.

Figure 6:
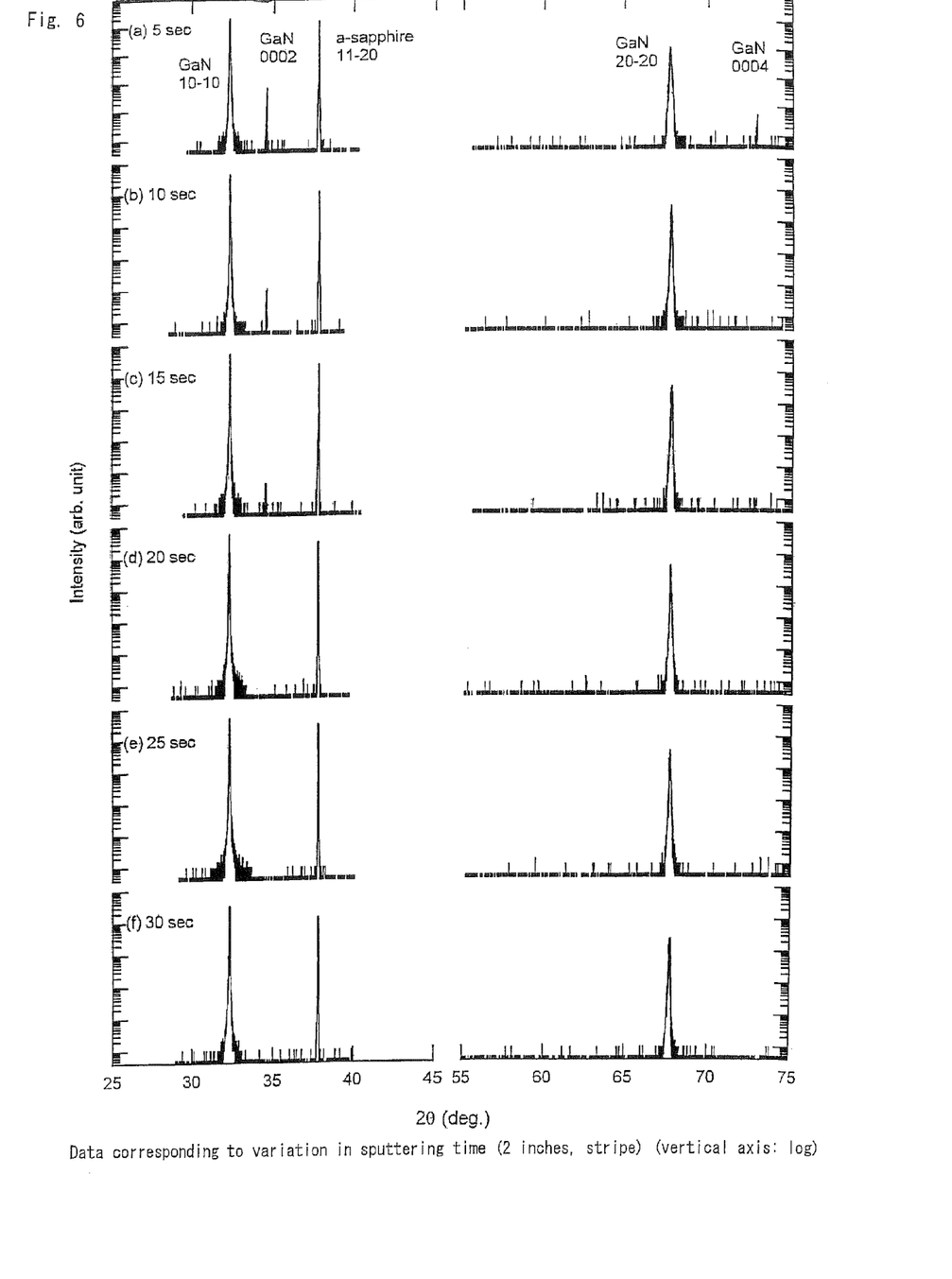
FIG. 6 shows the results of X-ray diffractometry of surfaces of GaN crystals 13.

FIG. 6 shows the results of X-ray diffractometry of a surface 13a of a GaN crystal 13 grown at 1,040° C. on a sapphire substrate 10 having (diameter: 2 inches) having grooves 11 (width: 1.5 µm, depth: 0.7 µm, interval: 1.5 µm). The time of sputtering for formation of an AlN film 12 was varied from 5 to 30 seconds at intervals of 5 seconds. As shown in FIG. 6, when the sputtering time for formation of the AlN film 12 was 5, 10, 15, 20, 25, or 30 seconds, peaks attributed to (10-10) plane and (20-20) plane (both assume an m-plane) were observed, and the thus-grown GaN crystal 13 was found to have an m-plane main surface. When the sputtering time was 5, 10, or 15 seconds, a peak attributed to (0002) plane (c-plane) was observed, and the thus-grown GaN crystal 13 was found to contain a crystal having a c-plane main surface. The intensity of the peak attributed to (0002) plane was gradually reduced as the sputtering time increased from 5 seconds to 15 seconds, and the peak attributed to (0002) plane was not observed when the sputtering time was 20 to 30 seconds. A peak attributed to (0004) plane (c-plane) was observed only when the sputtering time was 5 seconds; i.e., this peak was not observed when the sputtering time was 10 to 30 seconds. No peak attributed to a-plane was observed at any of the aforementioned sputtering times.

Thus, when the sputtering time was increased from 5 seconds to 15 seconds, there was produced a GaN crystal containing a small amount of a crystal having a c-plane main surface, and exhibiting good crystallinity. When the sputtering time was 20 to 30 seconds, there was produced a GaN crystal containing virtually no crystal having a c-plane main surface, and exhibiting the best crystallinity. When the sputtering time is 40 seconds, the thickness of the resultant AlN film 12 is about 150 to about 200 Å. Therefore, when the sputtering time is 20 to 30 seconds, the thickness of the resultant AlN film 12 is considered to be about 75 to about 150 Å.

Figure 7:
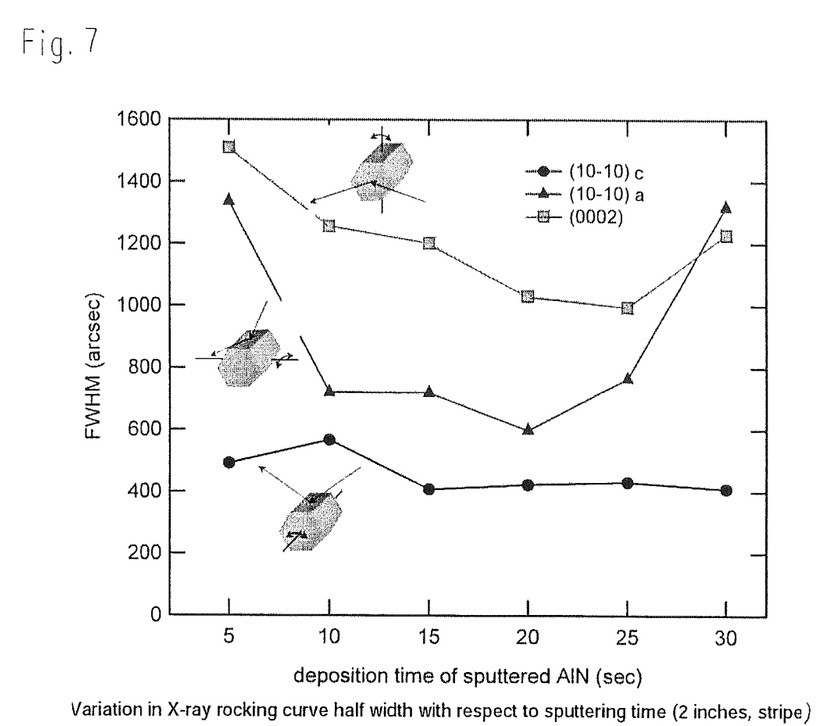
FIG. 7 is a graph showing the relationship between sputtering time for formation of an AlN film 12 and X-ray rocking curve half width.

FIG. 7 is a graph showing the relationship between sputtering time for formation of an AlN film 12 and X-ray rocking curve half width in the c-plane or m-plane of a GaN crystal 13. The sizes of the sapphire substrate 10 and the grooves 11, and the growth temperature of GaN crystal 13 were the same as those in the experiment whose results are shown in FIG. 6. The sputtering time for formation of the AlN film 12 was varied in the same manner as in the case of the experiment whose results are shown in FIG. 6 (i.e., varied from 5 to 30 seconds at intervals of 5 seconds). For obtaining data corresponding to m-plane, the X-ray rocking curve half widths in c-axis and a-axis directions of m-plane of a sample were determined by rotating the sample about both the a-axis and the c-axis. In the plotted data of X-ray rocking curve half width shown in FIG. 7, squares, triangles, and circles correspond to c-plane, c-axis direction of m-plane, and a-axis direction of m-plane, respectively.

As shown in FIG. 7, the X-ray rocking curve half width in a c-axis direction of m-plane was 600 to 800 arcsec when sputtering time was 10 to 25 seconds, and was approximately doubled when sputtering time was 5 seconds or 30 seconds. Thus, the crystal orientation in a c-axis direction of m-plane was high when sputtering time was 10 to 25 seconds. The X-ray rocking curve half width in an a-axis direction of m-plane was 400 to 600 arcsec at any of the aforementioned sputtering times; i.e., the crystal orientation in an a-axis direction of m-plane was high, regardless of sputtering time. The X-ray rocking curve half width in the c-plane was about 1,000 arcsec (sputtering time: 20 seconds or 25 seconds), about 1,200 arcsec (sputtering time: 10 seconds, 15 seconds, or 30 seconds), and about 1,500 arcsec (sputtering time: 5 seconds). Thus, when the sputtering time was 20 to 25 seconds, the crystal orientation in the c-plane was higher, as compared with the case of another sputtering time.

As is clear from the data shown in FIGS. 6 and 7, the GaN crystal 13 exhibits the most excellent crystallinity when the sputtering time is 20 to 25 seconds. In this case, the thickness of the AlN film 12 is considered to be about 75 to about 125 Å.

Figure 8:
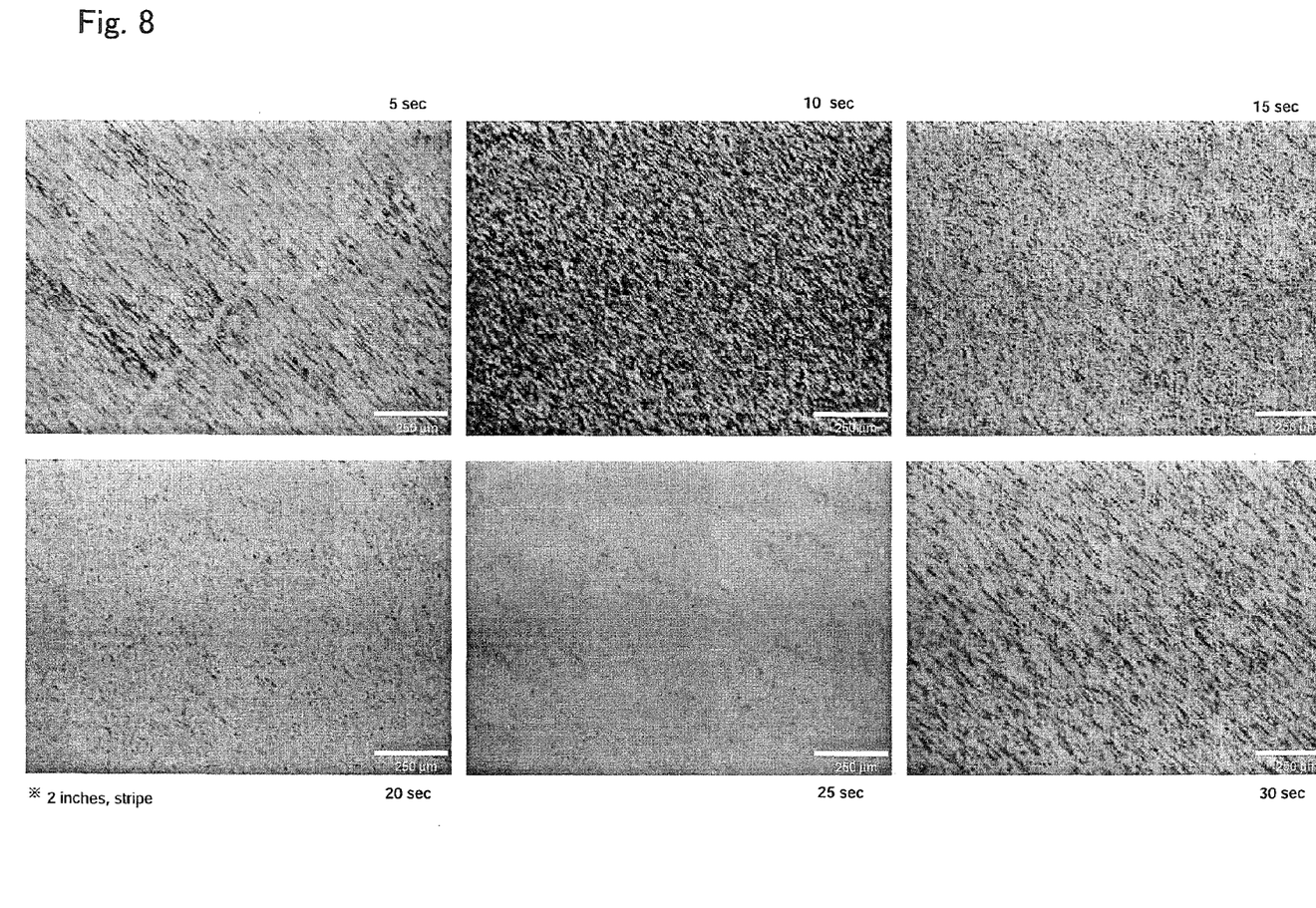
FIG. 8 is photographs showing surfaces of GaN crystals 13.

FIG. 8 shows photographs of the surfaces of GaN crystals 13 corresponding to the cases where the sputtering time for formation of an AlN film 12 was varied from 5 to 30 seconds at intervals of 5 seconds. The sizes of the sapphire substrate 10 and the grooves 11, and the growth temperature of GaN crystal 13 were the same as those in the experiment whose results are shown in FIG. 6 or 7. As is clear from FIG. 8, when the sputtering time is 15 seconds to 25 seconds (in particular, 25 seconds), high surface flatness is achieved, whereas the sputtering time is 10 seconds or 30 seconds, surface flatness is slightly impaired. As is also clear from FIG. 8, when the sputtering time is 5 seconds, surface flatness is lower as compared with the case where the sputtering time is 15 seconds to 25 seconds, but higher as compared with the case where the sputtering time is 10 seconds or 30 seconds. Conceivably, when the sputtering time is 15 seconds to 25 seconds, the thickness of the AlN film 12 is 55 to 125 Å, whereas when the sputtering time is 25 seconds, the thickness of the AlN film 12 is 90 to 125 Å.

GaN crystals 13 were grown at different growth temperatures, and the surfaces 13a of the thus-grown GaN crystals 13 were observed. The GaN crystals grown at 1,020 to 1,060° C. exhibited high surface flatness. Particularly, the GaN crystals grown at 1,030 to 1,050° C. exhibited higher surface flatness. The GaN crystal grown at 1,040° C. exhibited the most excellent surface flatness.

When, in the heating step, heating to a growth temperature was carried out in an atmosphere containing hydrogen and ammonia, the hydrogen content of the atmosphere was varied. The crystallinity of the resultant GaN crystal 13 or the flatness of the surface 13a of the GaN crystal 13 was slightly higher when the hydrogen content was increased.

Figure 9:
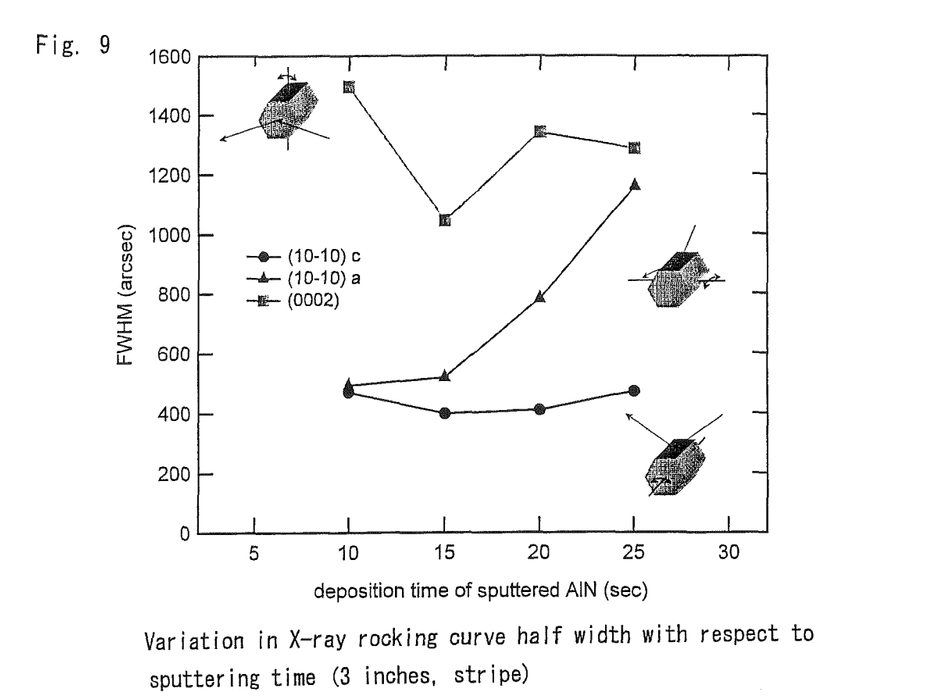
FIG. 9 is a graph showing the relationship between sputtering time for formation of an AlN film 12 and X-ray rocking curve half width when using 3-inches substrate.

FIG. 9 is a graph showing the relationship between sputtering time for formation of an AlN film 12 and X-ray rocking curve half width in the c-plane or m-plane of a GaN crystal 13. The diameter of the sapphire substrate 10 is 3 inches. The grooves 11, and the growth temperature of GaN crystal 13 were the same as those in the experiment whose results are shown in FIG. 6. The sputtering time for formation of the AlN film 12 was varied from 10 to 25 seconds at intervals of 5 seconds. For obtaining data corresponding to m-plane, the X-ray rocking curve half widths in c-axis and a-axis directions of m-plane of a sample were determined by rotating the sample about both the a-axis and the c-axis. In the plotted data of X-ray rocking curve half width shown in FIG. 9, squares, triangles, and circles correspond to c-plane, c-axis direction of m-plane, and a-axis direction of m-plane, respectively.

As shown in FIG. 9, the X-ray rocking curve half width in a c-axis direction of m-plane was 500 to 800 arcsec when sputtering time was 10 to 20 seconds. Thus, the crystal orientation in a c-axis direction of m-plane was high when sputtering time was 10 to 20 seconds. The X-ray rocking curve half width in an a-axis direction of m-plane was 400 to 500 arcsec at any of the aforementioned sputtering times; i.e., the crystal orientation in an a-axis direction of m-plane was high, regardless of sputtering time. The X-ray rocking curve half width in the c-plane was about 1,000 arcsec (sputtering time: 15 seconds), about 1,300 arcsec (sputtering time: 20-25 seconds), and about 1,500 arcsec (sputtering time: 10 seconds).

According to FIGS. 7 and 9 it is understood that the present invention is applicable to the large size diameter larger than 3 inches.

In Embodiment 2, a sapphire substrate is employed as the growth substrate. However, the growth substrate may be, instead of a sapphire substrate, a substrate formed of a hexagonal material such as SiC, Si, GaAs, ZnO, or spinel. In Embodiment 2, ICP etching is employed for forming grooves in the growth substrate. However, another dry etching technique, or an etching technique other than dry etching may be employed. In Embodiment 2, an AlN film is employed as the buffer film. However, the buffer film may be a film formed of, for example, GaN, AlGaN, AlInN, or AlGaInN. Particularly when the growth substrate is a sapphire substrate, the Al compositional proportion of the material of the buffer film is preferably high (the material is most preferably AlN), from the viewpoint of, for example, lattice matching. In Embodiment 2, reactive magnetron sputtering is employed for formation of the buffer film. However, any other sputtering technique may be employed.

Embodiment 2 corresponds to a method for producing a GaN template substrate. However, the present invention is not limited to GaN, but is applicable to a Group III nitride semiconductor such as AlN, AlGaN, InGaN, AlInN, or AlGaInN. The present invention is not limited to the production of such a Group III nitride semiconductor described in Embodiment 2 (i.e., Group III nitride semiconductor having an m-plane main surface), and can produce a Group III nitride semiconductor whose main surface is any non-polar plane or semi-polar plane, in consideration of the crystal orientation of the main surface of the growth substrate employed, the crystal orientation of the side surfaces of grooves formed in the growth substrate, and the lattice constant of the growth substrate. For example, when a sapphire substrate having an m-plane main surface is employed, and grooves are formed so that the side surfaces thereof assume a c-plane, a Group III nitride semiconductor having an a-plane main surface can be produced. Also, when a sapphire substrate having a c-plane main surface is employed, and grooves are formed so that the side surfaces thereof are a-plane, a Group III nitride semiconductor having an a-plane main surface can be produced.

In Embodiment 2, grooves are formed so that they are arranged in a stripe pattern as viewed from above. However, grooves may be formed in any pattern; for example, a grid pattern or a dot pattern. Since a Group III nitride semiconductor has polarity in a c-axis direction, when the side surfaces of a groove have different crystal orientations, a GaN crystal having different polarity directions is grown. Therefore, when grooves are formed in such a pattern that the side surfaces of each groove have many different crystal orientations, a Group III nitride semiconductor crystal having many different polarity directions is produced, which is not preferred. From such a viewpoint, stripe-pattern grooves are more advantageous than grooves formed in another pattern, since each stripe-pattern groove has only two side surfaces, and a Group III nitride semiconductor grown on the side surfaces exhibits polarity in only two directions. Stripe-pattern grooves are also advantageous in that the side surfaces of each groove have a large area, and thus the crystallinity and surface flatness of a Group III nitride semiconductor grown on the side surfaces are higher than those of a Group III nitride semiconductor grown on the side surfaces of grooves formed in another pattern.

In order to avoid growth of a crystal having different polarity directions, some of side surfaces of grooves may be covered with, for example, a mask, so that a Group III nitride semiconductor crystal is not grown on the thus-covered side surfaces. For example, when grooves are formed in a stripe pattern, and one of two side surfaces of each groove is covered with a mask so that a Group III nitride semiconductor is grown only on the other side surface, the resultant Group III nitride semiconductor exhibits polarity only in one direction; i.e., the semiconductor exhibits good quality.

Alternatively, in order to avoid growth of a crystal having different polarity directions, side surfaces of grooves may be inclined so that the side surfaces exhibits a crystal orientation in which crystal growth is less likely to occur. When, for example, a sapphire substrate is employed as a growth substrate, the smaller the angle between the side surfaces of grooves formed in the substrate and the c-plane or a-plane of sapphire, the more likely a crystal is grown on the side surfaces. In this case, when the side surfaces of the grooves assume a c-plane or a-plane, a crystal is most likely to grow on the side surfaces. Therefore, when, for example, side surfaces of grooves on which a Group III nitride semiconductor crystal is grown assume a c-plane, and the other groove side surfaces on which no crystal growth is desired are inclined with respect to c-plane, growth of a crystal having different polarity directions can be avoided.

According to the present invention, there is produced a Group III nitride semiconductor whose main surface is a non-polar plane (e.g., m-plane or a-plane) or a semi-polar plane (e.g., r-plane). Therefore, the present invention facilitates production of a Group III nitride semiconductor device which is not affected by a piezoelectric field.

What is claimed is:

1. A semiconductor substrate, comprising:
    a sapphire substrate including a c-plane main surface and comprising a groove in a surface thereof, the groove including side surfaces and a bottom surface; and
    a Group III nitride semiconductor layer formed on the sapphire substrate,
    wherein the side surfaces of the groove are an a-plane of sapphire,
    wherein an axis of the Group III nitride semiconductor layer, perpendicular to one of the side surfaces of the groove, is a c-axis of Group III nitride semiconductor, and
    wherein a plane of the Group III nitride semiconductor, parallel to the main surface of the sapphire substrate, is an a-plane of Group III nitride semiconductor.

2. A semiconductor substrate according to claim 1, wherein the surface of the sapphire substrate is nitrided, and the Group III nitride semiconductor layer is formed without depositing a buffer layer.

3. A semiconductor substrate according to claim 1, wherein the sapphire substrate comprises a buffer film formed along an entire surface thereof, and the Group III nitride semiconductor layer is formed via the buffer film on the sapphire substrate.

4. A semiconductor substrate according to claim 1, wherein the groove is formed in a stripe pattern.

5. A semiconductor substrate according to claim 3, wherein the buffer film comprises $Al_xGa_{1-x}N$ ($0 \leq x \leq 1$).

6. A semiconductor substrate according to claim 5, wherein the buffer film has a thickness of 150 Å or less.

* * * * *